(12) United States Patent
Bourrieres et al.

(10) Patent No.: US 8,282,066 B2
(45) Date of Patent: Oct. 9, 2012

(54) METHOD OF USING A UNIVERSAL INTERMEDIATE SUPPORT

(75) Inventors: Francis Bourrieres, Montauban (FR); Clement Kaiser, Montauban (FR)

(73) Assignee: Novatec SA, Montauban (FR)

( * ) Notice: Subject to any disclaimer, the term of this patent is extended or adjusted under 35 U.S.C. 154(b) by 996 days.

(21) Appl. No.: 12/280,484

(22) PCT Filed: Mar. 14, 2007

(86) PCT No.: PCT/FR2007/000454
§ 371 (c)(1),
(2), (4) Date: Aug. 22, 2008

(87) PCT Pub. No.: WO2007/104869
PCT Pub. Date: Sep. 20, 2007

(65) Prior Publication Data
US 2009/0014618 A1   Jan. 15, 2009

(30) Foreign Application Priority Data
Mar. 16, 2006 (FR) ...................... 06 02291

(51) Int. Cl.
*A47G 29/00* (2006.01)
(52) U.S. Cl. ........ 248/683; 248/309.3; 269/21; 269/266
(58) Field of Classification Search ............ 248/362, 248/363, 683, 309.3, 205.5, 620, 621, 619, 248/537; 269/21, 266, 289, 289 R; 254/93 HP; 174/524; 29/281.6; 279/3
See application file for complete search history.

(56) References Cited

U.S. PATENT DOCUMENTS

| | | | | |
|---|---|---|---|---|
| 3,830,896 A | * | 8/1974 | Flicker et al. | 264/45.2 |
| 5,176,424 A | * | 1/1993 | Tobita et al. | 297/284.1 |
| 5,351,830 A | * | 10/1994 | Bender et al. | 206/524.8 |
| 5,410,791 A | * | 5/1995 | Wirth et al. | 29/235 |
| 5,906,364 A | * | 5/1999 | Thompson et al. | 269/22 |
| 7,527,271 B2 | * | 5/2009 | Oh et al. | 279/3 |
| 2008/0029945 A1 | * | 2/2008 | Kaiser et al. | 269/21 |

FOREIGN PATENT DOCUMENTS

| | | |
|---|---|---|
| FR | 2870318 | 11/2005 |
| FR | 2870319 | 11/2005 |
| WO | WO 2005/116512 | 12/2005 |

OTHER PUBLICATIONS

PCT Search Report for WO 2007/04869.
Unedited machine translation of FR 2870318.
Unedited machine translation of WO 2005/116512.

* cited by examiner

*Primary Examiner* — Terrell McKinnon
*Assistant Examiner* — Eret McNichols
(74) *Attorney, Agent, or Firm* — Vidas, Arrett & Steinkraus P.A.

(57) ABSTRACT

The present invention is a method for using a universal support consisting of one or more modules having a deformable enclosure (3) connected to a vacuum source (5) through an orifice. Said enclosure is of concave shape forming a chamber (6) provided with a flexible body (7). The method consists in the following series of steps: applying a vacuum to the chamber (6) so that the deformable enclosure (3) collapses; positioning the part which is to be supported; breaking the vacuum in the chamber (6); and applying a vacuum inside the deformable enclosure (3).

15 Claims, 5 Drawing Sheets

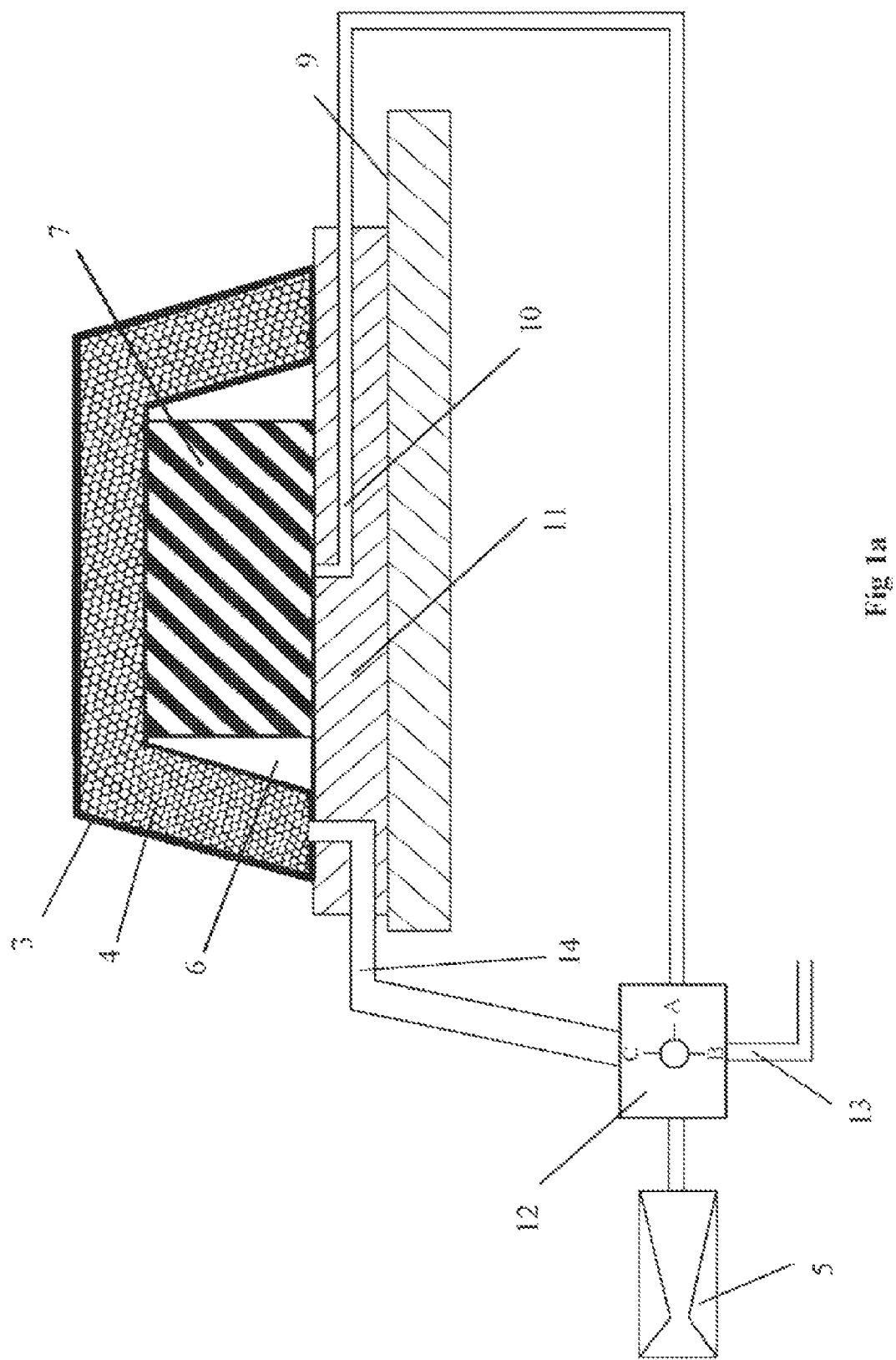

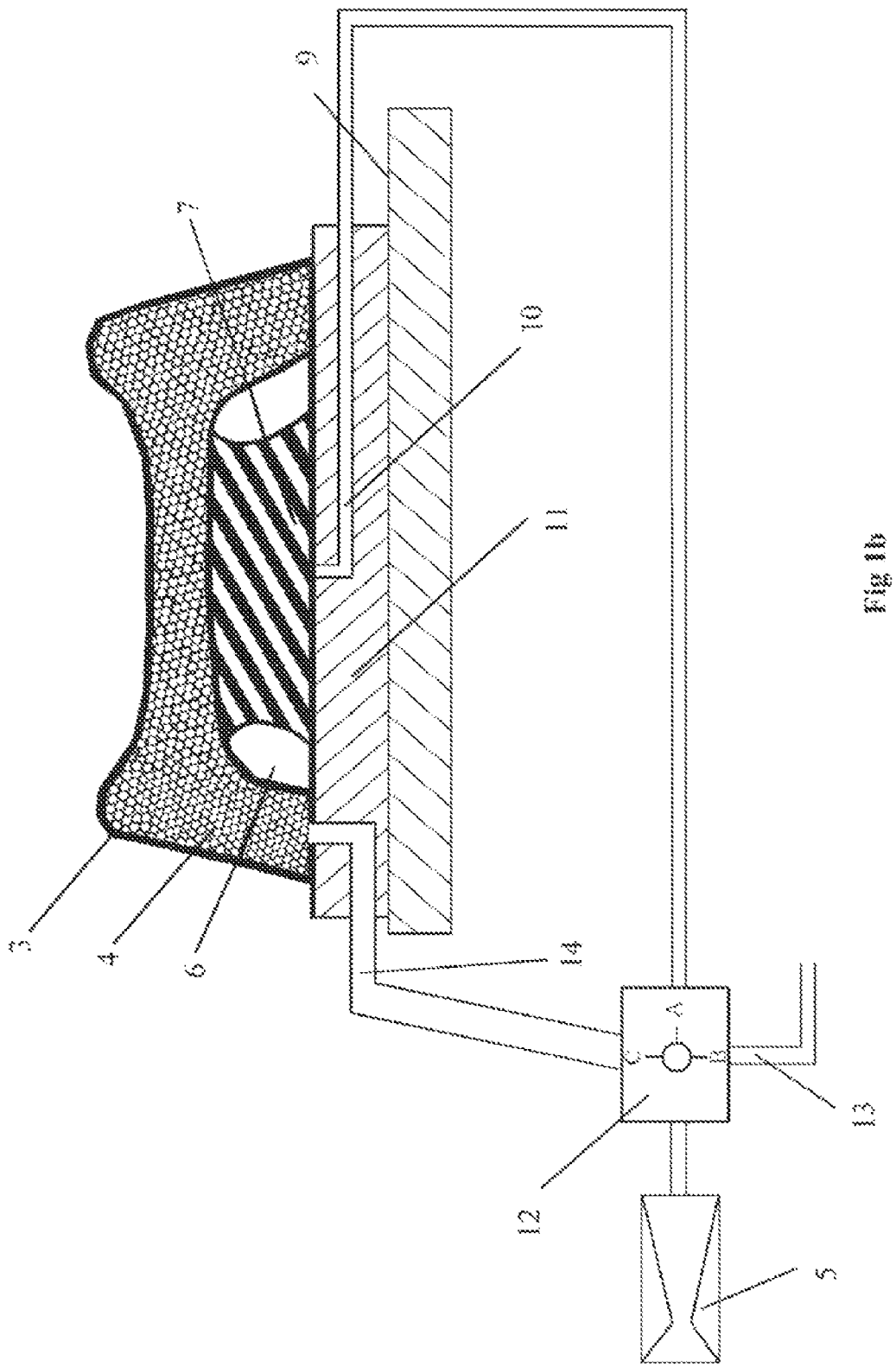

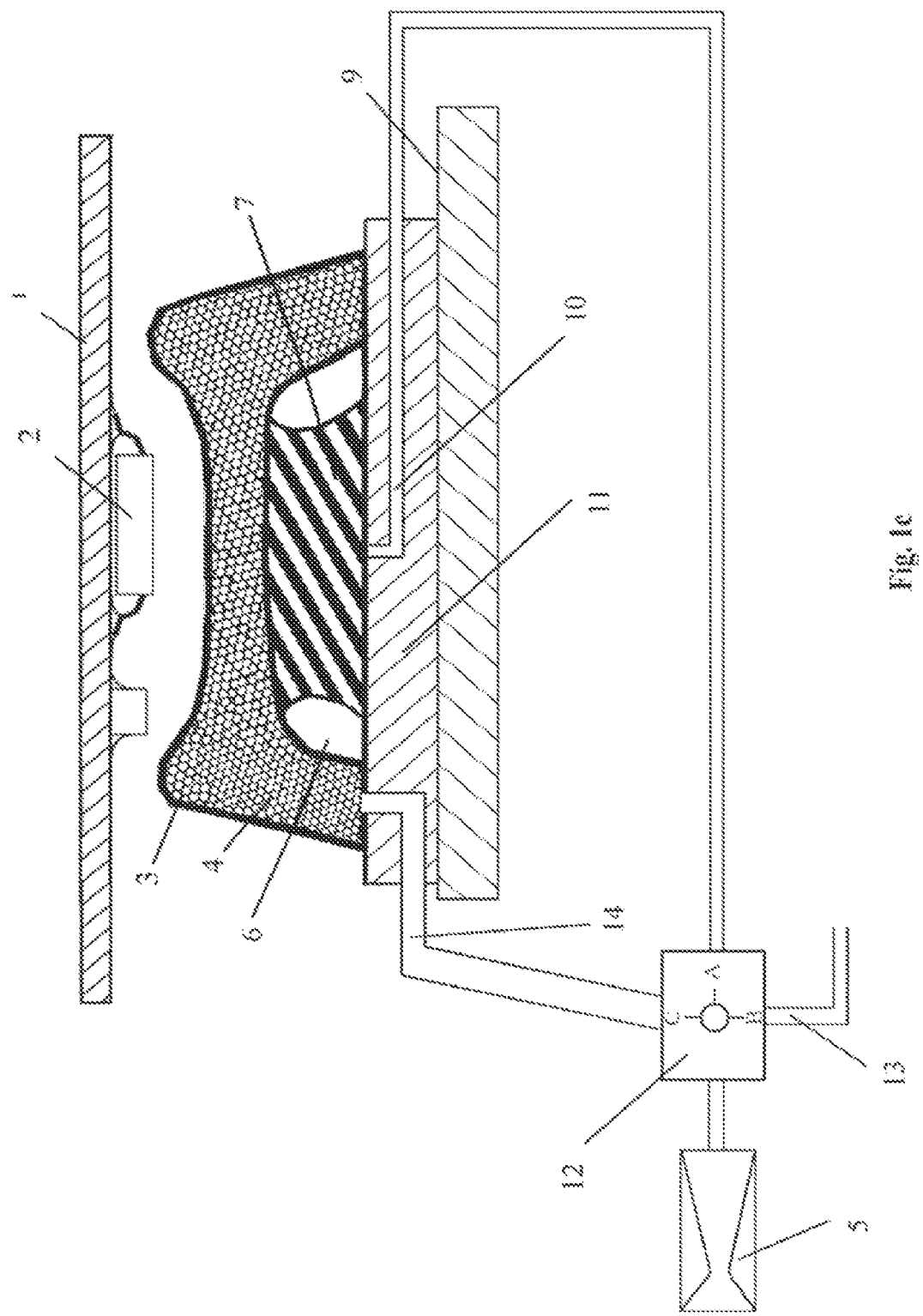

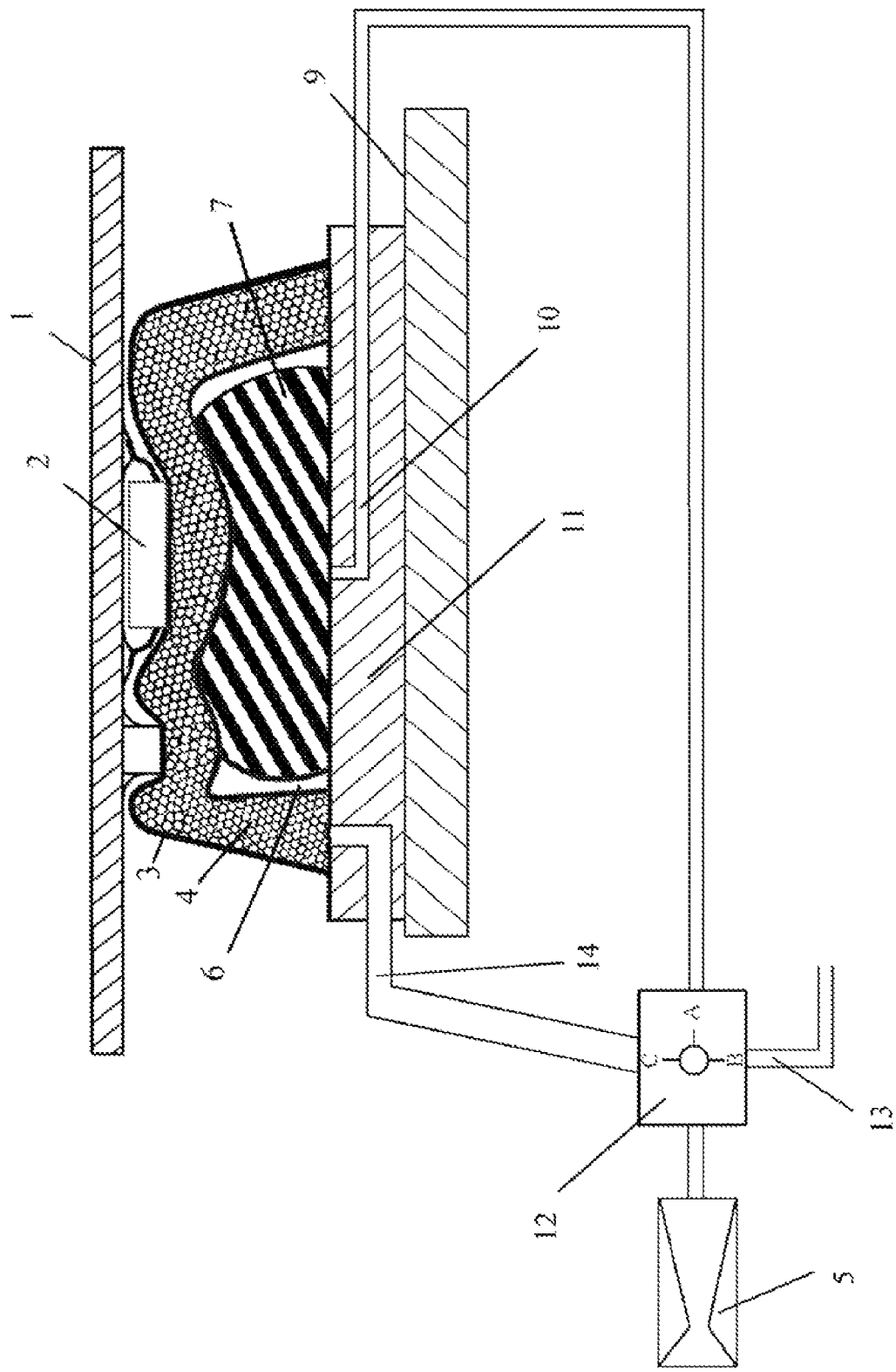

METHOD OF USING A UNIVERSAL INTERMEDIATE SUPPORT

BACKGROUND

The method and the device which is the object of this invention make it possible to facilitate and optimize the implementation of a device as described in patent applications FR 2870318 and FR 2870319 as well as in the extension WO/2005/116512 of the same applicant and inventors. The use of this invention is particularly suitable for setting up electronic card support devices during their assembly on automatic printing machines when installing electronic components or when applying adhesive.

According to the prior art described in patent applications FR 2870318 and FR 2870319, regulation of universal electronic card support is obtained by putting into contact and supporting the product to be supported on the universal support, then a vacuum is applied within an sealed enclosure which causes the support to be stiffened therein. Positioning the part on the support makes it possible to crush the flexible body and in this way the shape of the product to be supported is contoured by the enclosure. When the part to be supported is an electronic card, it is advisable to apply a flat plate to the top of the card to rectify it before applying the vacuum within the enclosure. Using this type of support plate and the force implied is sometimes unacceptable. In some equipment, the force is too great and may cause the product to be elevated more than is desirable for a certain job.

BRIEF SUMMARY OF THE INVENTION

The object of this invention is to facilitate the implementation of the universal support device described in patent application WO/2005/116512. This invention refers to a method and a device for implementing a support system or universal support for a random and/or possibly complex shape on a work level determined in relationship to a rigid base.

Specifically, this invention seeks to reduce and even remove the force applied to the product to be supported on the universal support compared to the reference level in operating position and before the product is shaped on the deformable enclosures. The universal support is made up of one or more modules containing at least one deformable enclosure that is sealed, filled with particles and connected to a vacuum source by an opening and said enclosure contains a concave area placed at least partially between the deformable enclosure and the table upon which the support rests. The concave area in the deformable enclosure is in fact a free space that is placed between the deformable enclosure and the equipment table. When a part is applied to the deformable enclosure this free space is reduced by crushing and in this way it is possible for the deformable enclosure to shape the form of the product to be supported. The flexible body makes it possible to push the deformable enclosure back to its initial position when the vacuum is broken within the enclosure. It is imperative for this invention that there be a chamber which is partially or entirely formed by the concave area and suitable for connection to a vacuum source. Compared to the process of implementation described in the prior art, shaping of the deformable enclosure is performed without deformation thus practically no force is exerted on the circuit or the object to be supported. In the prior art, searching for the operating position is performed by exerting pressure upon the top of the circuit downwards in the direction of the sealed enclosure, which resists a significant deformation reaction that is the total of the deformation force upon the concave chamber, but above all against the force that shifts the mobile particles within the sealed enclosure which perfectly mold to the forms to be supported. However in this invention, the search for the operating position is obtained by placing the circuit in this position beforehand while maintaining the vacuum in the flexible concave chamber, only then is the vacuum removed from said chamber, and in this way the latter causes an upward shift in the bottom of the chamber until it contacts the circuit which constitutes the operating reference plane. In this manner, the force exerted on the circuit is not equal to the reaction of the flexible concave chamber knowing that the force connected to the shift in the mobile particles within the sealed enclosure is nonexistent. In this case shown in the figure, even if the molding around the projecting parts is reduced, it is sufficient to then oppose an acceptable contact surface in the operating position.

The invention is characterized essentially in that it consists of the following steps:

Application of a vacuum in the chamber formed by the concave area in such a way as to cause said concave area and the flexible body to be crushed and to cause the collapse of the deformable enclosure. Thus according to the invention, the crushing of the deformable enclosure and the concave area is no longer obtained by holding the part to be supported on the enclosure by force prior to the deformation of said enclosure, but by the vacuum applied to the chamber which causes the compression of the flexible body and the reduction of the chamber's volume which involves a significant reduction of the higher level thus making it possible to position the circuit unconstrained without the position of reference.

Installation of the part to be supported. Generally the installation is carried out automatically by means of a conveying system equipping the automatic machines.

Breaking the vacuum from the chamber so that the flexible body slackens and pushes the deformable enclosure into contact with the part to be supported and thus molds the shape of the part to the deformable enclosure. Thus contrary to the prior state of the art where it is necessary to press upon the product to be supported in order to mold the deformable enclosure as well as the flexible body present in the concave form, with this invention the elasticity of the flexible body present in the concave zone is used to push the deformable enclosure into contact with the part to be supported thereby molding to its shape. Consequently the force applied to the part is much less. Indeed, according to the prior art, the force required to form the deformable enclosure is the sum of the forces required to overcome the force of friction of the particles present in the deformable enclosure and of the force required to crush the flexible body present in the concave form. Thanks to this invention, the force applied to the product to be supported is the difference between the force generated by the relaxation of the flexible body and the force of the friction of the particles.

Application of a vacuum in the deformable enclosure so as to stiffen the enclosure during an assembly or treatment operation.

According to another characteristic of the invention, the device to implement this invention consists of at least one vacuum source and a dial with at least three positions, the first connecting the vacuum source inside the chamber, the second ensuring the set up of the chamber and the enclosure's exhaust and the third connecting the vacuum source to the sealed enclosure.

BRIEF DESCRIPTION OF THE DRAWINGS

FIG. 1a shows the support device of the present invention in the repose position with a flexible body.

FIG. 1b shows the support device when the dial is in position A.

FIG. 1d shows the support device with an object whose shape is to be molded into the flexible body.

FIG. 1e shows the support device with the object of FIG. 1d removed.

DETAILED DESCRIPTION OF THE INVENTION

Figure 1C:
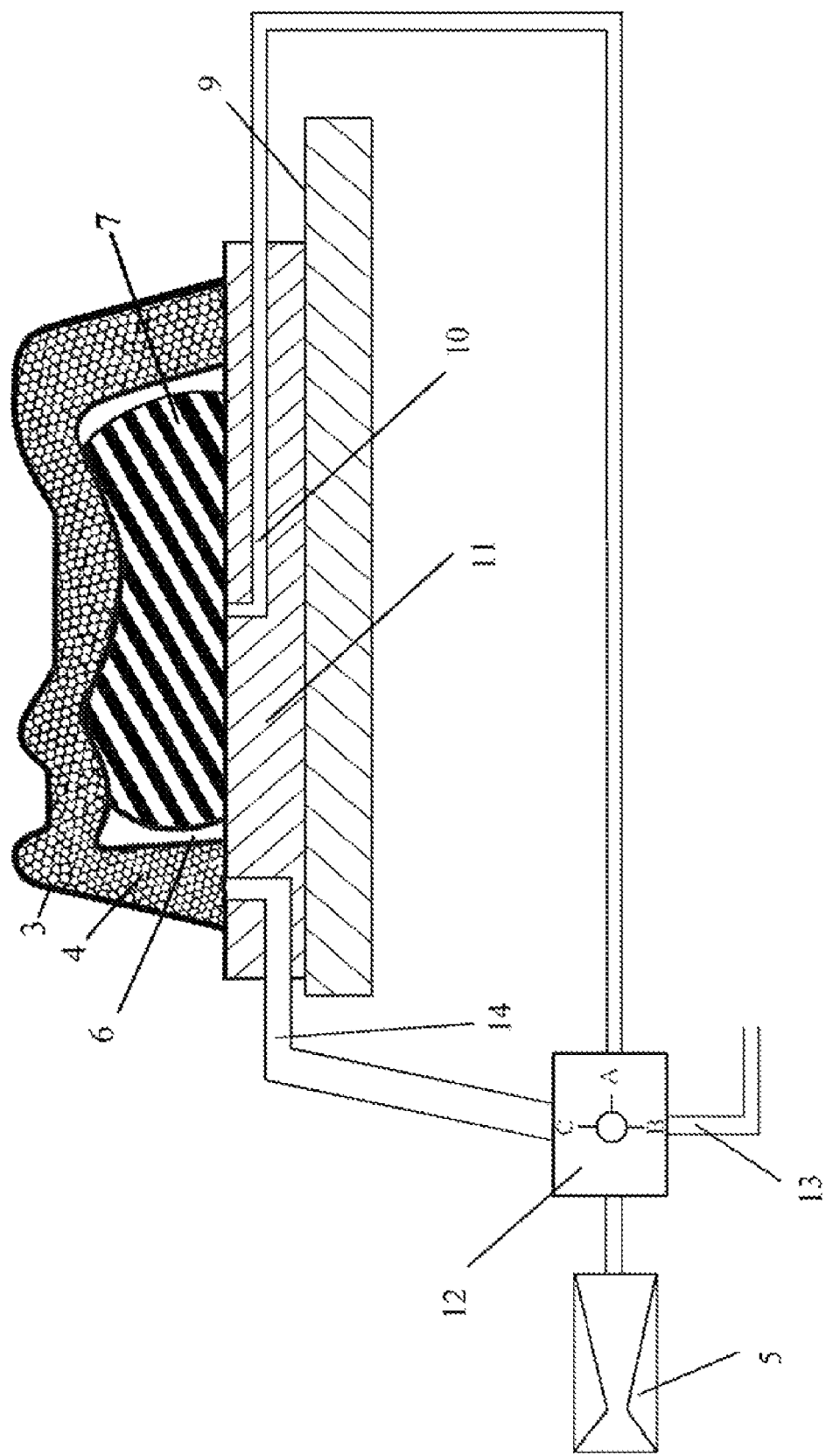
FIG. 1c shows the support device in the operating position.

FIG. 1 shows the implementation of the method and the device of this invention. The support device is constituted by at least one sealed and deformable enclosure (3) containing the particles (4) and which has a concave form. This concave form is located between the support table (9) and the deformable enclosure (3) thanks to the base plate (11), the concave area forms a chamber (6) partially filled by a flexible body (7) and suitable for connection to a vacuum source by (10). The device that is the object of this invention is made up of at least one vacuum source (5) and of a dial with at least three positions (12).

In FIG. 1a, the support device is shown in the repose position.

In FIG. 1b, the dial (12) is in position A, thus the chamber (6) is connected to the vacuum source (5) via (10). The vacuum in the chamber (6) causes the volume of the chamber to be reduced, crushes the flexible body (that typically is made of open-cell foam) and collapses the deformable enclosure (3).

In FIG. 1c, the part to be supported is shown in the operating position. In the case shown, the part to be processed is an electronic card (1) already equipped with components (2) on the lower surface. Generally the card is brought into the operation position by a conveyor which is not shown.

In FIG. 1d, the dial (12) is in position B, which causes the chamber (6) and the enclosure (3) to connect to the exhaust (13). The fact that the vacuum is eliminated from the chamber (6) causes the flexible body (7) to relax which in turn pushes the enclosure (3) into contact with the part to be supported by molding to its form. To guarantee perfect evenness in the card (1), it may be advisable to place a flat cover on its upper surface, but in the majority of cases, this is not necessary. Once the enclosure (3) is molded to the shape of the part to be supported, the dial is placed in position C which connects the vacuum source (5) to the inside of the deformable enclosure via line 14. Thus, the enclosure (3) is frozen in that state and perfectly supports the part to be supported for the duration of the operation to be carried out on the part.

In FIG. 1e, the card (1) is removed but the shape of the card is memorized and maintained in order to process the following card.

In the case shown in FIG. 1, the only vacuum source (5) is shown by performing the vacuum in the chamber (6) as well as in the deformable enclosure (3) but it is possible to use two different vacuum sources.

According to another characteristic of the invention, the support device is formed for each card as it is presented on the machine.

FIG. 1 shows one single deformable enclosure but it is obvious that the method is also applied if several enclosures are juxtaposed to adapt to the width of the card.

The invention claimed is:

1. A method for using a device to support a part, the device having a base plate, at least one deformable sealed enclosure filled with particles and connected to a vacuum source, the deformable sealed enclosure having an outer surface and a concave inner surface, a chamber defined by the concave inner surface of the at least one deformable enclosure and at least a portion of the base plate, the chamber also connected to the vacuum source, and a flexible body disposed within the chamber of the at least one deformable sealed enclosure the method comprising the following steps:

applying a vacuum from the vacuum source to the chamber in such a way as to collapse the deformable sealed enclosure and crush the flexible body removing the vacuum from at least the chamber so that the flexible expands and pushes the deformable sealed enclosure into contact with the part, and applying a vacuum to the deformable sealed enclosure (3) so as to stiffen the deformable sealed enclosure.

2. A support device comprising:

a base plate;

at least one deformable sealed enclosure filled with particles, the at least one deformable sealed enclosure resting on top of the base plate; wherein the at least one deformable sealed enclosure has a concave inner surface;

a chamber defined by the concave inner surface of the at least one deformable enclosure and at least a portion of the base plate;

a flexible body disposed within the chamber; and a vacuum source in communication with at least one of the deformable sealed enclosure and the chamber; and a control that selectively connects and disconnects at least one of the chamber and the deformable sealed enclosure from the vacuum source, wherein the control has at least two positions, wherein when the control is in the first position, the vacuum source is connected to the chamber; wherein when the control is in the second position, the deformable enclosure and the chamber are connected to an exhaust.

3. The support device of claim 2, wherein the flexible body comprises an open-cell foam material.

4. The support device of claim 2, further comprising a support table upon which the base plate rests.

5. The support device of claim 4, wherein one surface of the base plate abuts one surface of the support plate.

6. The support device of claim 2, wherein the control has at least three positions, wherein in the third position, the vacuum source is connected only to the deformable sealed enclosure.

7. The support device of claim 2, wherein the base plate has a first orifice and a second orifice.

8. The device of claim 7, wherein the first orifice connects the chamber to the control and the second orifice connects the deformable sealed enclosure to the control.

9. The device of claim 2, wherein the control comprises a dial.

10. The device of claim 2, wherein the flexible body directly contacts one surface of the base plate.

11. The method of claim 1, wherein the device has a control that selectively connects and disconnects at least one of the chamber and the deformable sealed enclosure from the vacuum source.

12. The method of claim 11, wherein the control has a first position, and the step of applying a vacuum from the vacuum source to the chamber occurs when the control is in the first position.

13. The method of claim 12, wherein the control has a second position, and the step of removing the vacuum from at least the chamber occurs when the control is in the second position.

14. The method of claim 13, wherein the control has a third position, and the step of applying a vacuum to the deformable sealed enclosure occurs when the control in a third position.

15. The method of claim 11, wherein the control comprises a dial with at least three positions.

* * * * *